(12) United States Patent
Yuan et al.

(10) Patent No.: US 12,013,442 B2
(45) Date of Patent: Jun. 18, 2024

(54) IN-LINE DETECTION OF ELECTRICAL FAILS ON INTEGRATED CIRCUITS

(71) Applicant: Intel Corporation, Santa Clara, CA (US)

(72) Inventors: Enlan Yuan, Portland, OR (US); David Sanchez, Portland, OR (US); Amit Paliwal, Hillsboro, OR (US); Manish Sharma, Portland, OR (US); Sairam Subramanian, Portland, OR (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1004 days.

(21) Appl. No.: 16/147,564

(22) Filed: Sep. 28, 2018

(65) Prior Publication Data

US 2020/0103451 A1 Apr. 2, 2020

(51) Int. Cl.
| | |
|---|---|
| *H01L 21/66* | (2006.01) |
| *G01R 31/28* | (2006.01) |
| *G01R 31/307* | (2006.01) |
| *G01R 31/50* | (2020.01) |
| *H01L 27/02* | (2006.01) |

(52) U.S. Cl.
CPC ......... *G01R 31/50* (2020.01); *G01R 31/2853* (2013.01); *G01R 31/2884* (2013.01); *G01R 31/307* (2013.01); *H01L 22/32* (2013.01); *H01L 22/34* (2013.01)

(58) Field of Classification Search
CPC ......... H01L 22/12; H01L 22/20; H01L 22/34; H01L 22/32; H01L 22/14
See application file for complete search history.

(56) References Cited

U.S. PATENT DOCUMENTS

| | | | | |
|---|---|---|---|---|
| 7,930,660 | B2 * | 4/2011 | Ruderer | G03F 1/44 |
| | | | | 716/54 |
| 9,627,371 | B1 * | 4/2017 | Lam | H01L 22/26 |
| 10,593,604 | B1 * | 3/2020 | Lam | G06V 10/987 |
| 10,975,438 | B2 * | 4/2021 | Royer | C12Q 1/6883 |
| 2013/0175599 | A1 * | 7/2013 | Yang | H01L 22/14 |
| | | | | 257/E21.531 |
| 2019/0295940 | A1 * | 9/2019 | Liaw | H01L 23/5222 |

* cited by examiner

*Primary Examiner* — Anthony Ho
*Assistant Examiner* — David J Goodwin
(74) *Attorney, Agent, or Firm* — Schwabe, Williamson & Wyatt P.C.

(57) ABSTRACT

Embodiments of the present disclosure relate to in-line detection of electrical fails on integrated circuits. One embodiment is an apparatus including a device region with integrated circuits and a test region for in-line failure detection of the integrated circuits using an in-line voltage contrast test, the apparatus comprising: a substrate including a first area for the device region and a second different area for the test region; metal layers formed over both areas; wherein the integrated circuits are formed from first sections of the layers; and wherein a second section of an upper metal layer of the layers is segmented into test segments, each test segment to exhibit a predefined response during the in-line voltage contrast test depending on whether the test segment is shorted, or not, to the substrate and/or the second section of a gate layer of the layer. Other embodiments may be disclosed and/or claimed.

14 Claims, 8 Drawing Sheets

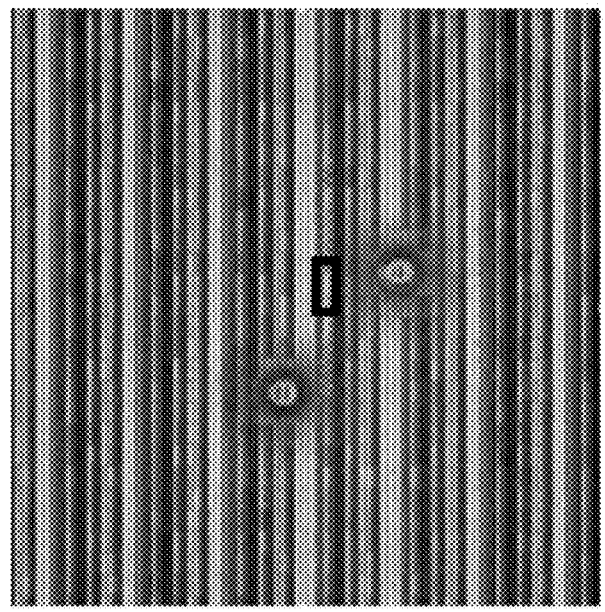
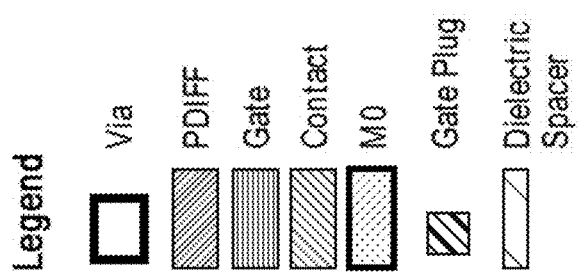
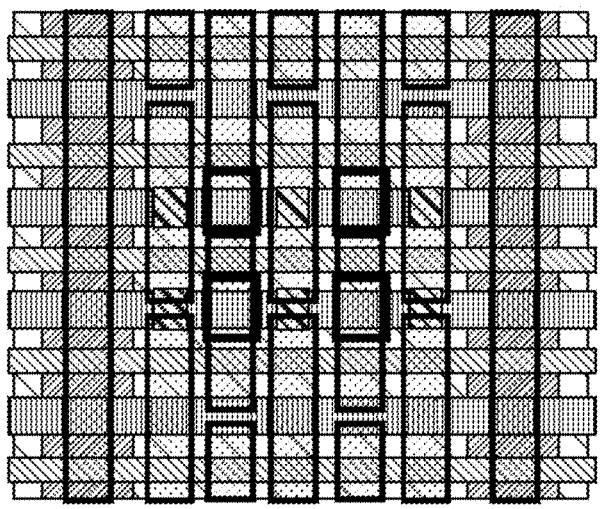
FIG. 7A
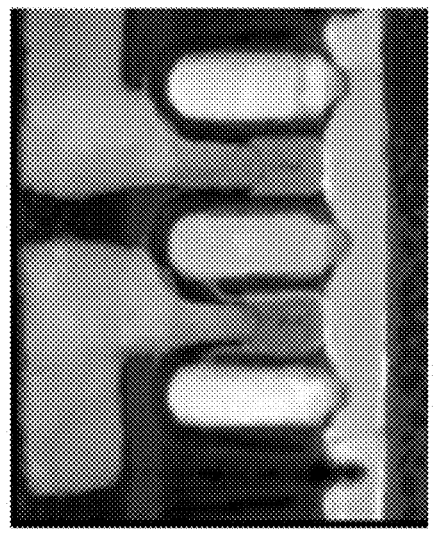
FIG. 7B
FIG. 7C

IN-LINE DETECTION OF ELECTRICAL FAILS ON INTEGRATED CIRCUITS

TECHNICAL FIELD

The present disclosure relates to the field of semiconductors. More specifically, the present disclosure is related to in-line detection of electrical fails on integrated circuits.

BACKGROUND

With every advancement in transistor technology advancing Moore's law—semiconductor yield learning has become progressively more challenging. Most semiconductor manufacturers rely on a two-pronged approach to yield advancement—inline metrology to detect random defects and end of line analysis post in fab processing to validate transistor functionality and chip health pertaining to the technology targets and debug of systematic defect modes. As the fin, gate and metal pitches and critical dimensions have scaled aggressively the systematic modes have dominated the yield Pareto of defects rendering inline metrology of random defects ineffective. The process flow has also exponentially increased with each technology node owing to the pitch doubling and quadrupling that has to be done for hyperscaling. This causes the data turnaround from the end of line analysis to be slow which in turn cripples yield learning and elongates the product development cycle. Thus, inline detection of defects buried in a stack like underetch/overetch that would cause systematic shorts and opens becomes a critical gate to process development.

BRIEF DESCRIPTION OF THE DRAWINGS

FIG. 7A is a diagram (top view) of a test structure for detection of gate via to contact shorts, according to various embodiments.

FIG. 7B is an e-beam image (top view) of a test structure similar to the test structure of FIG. 7A, according to various embodiments.

FIG. 7C is a transmission electronic microscope image (cross section) of a selected test structure exhibiting a gate via to contact short, according to various embodiments.

DETAILED DESCRIPTION

Figure 1:
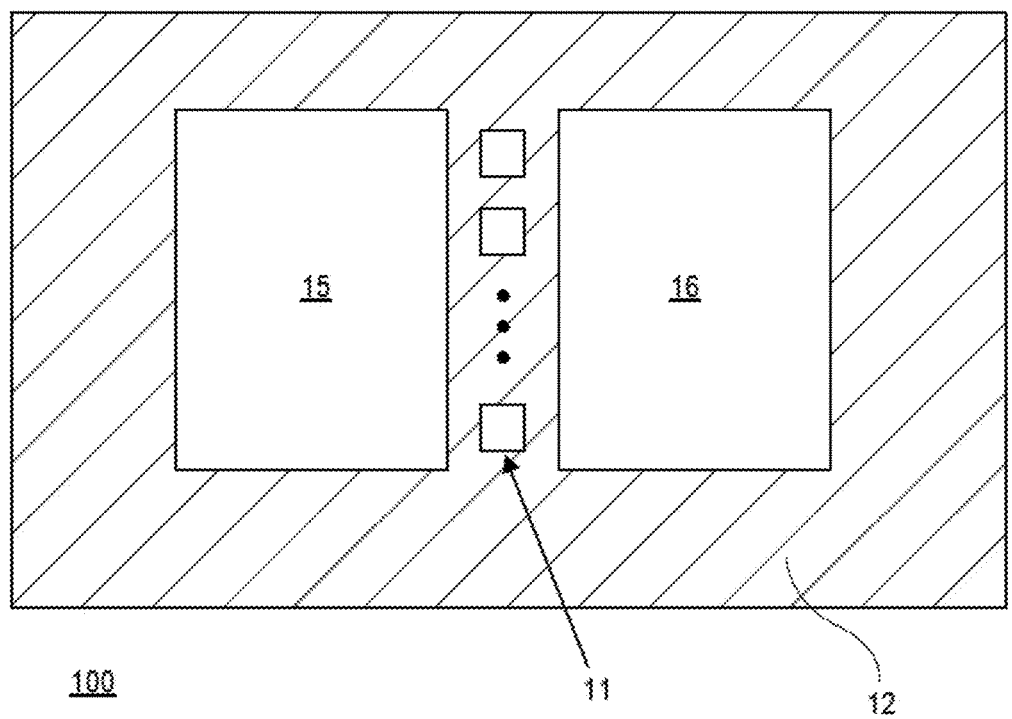
FIG. 1 is a diagram (top view) of a chip including test segments for in-line detection of electrical fails on integrated circuits, according to various embodiments.

Described herein is in-line detection of electrical fails on integrated circuits. In the following description, various aspects of the illustrative implementations will be described using terms commonly employed by those skilled in the art to convey the substance of their work to others skilled in the art. However, it will be apparent to those skilled in the art that the embodiments described herein may be practiced with only some of the described aspects. For purposes of explanation, specific numbers, materials and configurations are set forth in order to provide a thorough understanding of the illustrative implementations. However, it will be apparent to one skilled in the art that the described embodiments may be practiced without the specific details. In other instances, well-known features are omitted or simplified in order not to obscure the illustrative implementations.

Various operations will be described as multiple discrete operations, in turn, in a manner that is most helpful in understanding the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Some integrated circuit manufacturing relies on post fabrication electrical testing and fault isolation to identify systematic defects such as plug/via underetch/overetch which cause electrical opens and shorts. This end of line detection may cause a very slow data turnaround at hyperscaled process nodes such as 10 nm or 7 nm and beyond, which may significantly limit or slows yield learning and process development.

Some embodiments described herein may include a test structure formed on a different area of the substrate than an area on which the integrated circuits are formed. The test structure may be used for inline detection of via opens and shorts, gate/contact/metal end to end shorts, or the like, through charge accumulation or voltage contrast. The test structure may have no circuit or transistor functionality, but may be fabricated solely to speed up the data turnaround and accelerate the process development cycle. This inline detection using the test structure may identify a likelihood of systematic opens and shorts in the integrated circuit, which may be prior to e-test/SORT/FA/FA, which may help speed up process learning and shorten the process development cycle.

FIG. 1 is a diagram (top view) of a chip 100 including test segments 11 for in-line detection of electrical fails on integrated circuits, according to various embodiments. The chip 100 may include a substrate including a device region formed on an area of the substrate. The device region may include different non-contiguous areas 15 and 16, and different components of the chip 100 may be formed in the non-contiguous areas, respectively. For instance, in one example, the chip 100 may be a processor SoC (system on chip), and a first core may be formed in area 15 and a second core may be formed in an area 16. In other examples, the components of the chip may include other components such as additional cores, a graphics component, or the like.

Any portion of a remaining area 12 of the substrate of the chip 100 (e.g., a filler region) may be used for a test region. For instance, test structures for inline detection of electrical fails on integrated circuits may be fabricated in any portion of the remaining area 12. The test structures may include at least test segments 11, and may be formed between the non-contiguous areas 15 and 16 (as illustrated) and/or in other locations (not illustrated). In some embodiments, in the test region (the region including the test segments 11), one or more components below (not shown) at least some of the test segments 11 may intentionally ground the gate layer to the substrate in the test region.

The test segments 11 may be arranged in one or more rows, although it may be possible and practical to arrange the test segments 11 in any pattern. Also, for brevity, the illustrated example shows one row; however, in other examples one or more additional parallel rows may be provided to form a grid of test segments 11.

In some embodiments, a row of the test segments 11 may include floating ones of the test segments 11 and selected intentionally grounded ones of the test segments 11. For instance, one or more selected test segments 11 may be formed on a via (not shown) to electrically connect the selected test segment 11 to the substrate and/or the gate layer of the test region, while one or more floating test segments 11 may be formed on an insulator. When the test region is subjected to an extraction field of an e-beam tool, the selected test segments 11 may appear bright if their respective via makes contact due to a steady supply of electrons from the substrate. If there is a defect that causes one of the vias to be "open," the respective selected test segment 11 may appear dark (e.g., may appear floating) under the test. The floating test segments 11 may be spaced at appropriate intervals in a same row of the selected test segments 11 and/or in dark rows between rows of the selected test segments 11 to more easily resolve defects using the e-beam tool and to optimize e-beam scan efficiency.

An indication of a defect in the test region may indicate a likelihood of a defect in a corresponding portion of the device region, e.g., about a buried structure of the device region. This is in contrast to some integrated circuit manufacturing, where a defect of a buried structure in the device region may not be detected until end of line testing. Also, information about which location in the test region includes the defect may support targeted validation/inspection of the corresponding portion of the device region. Validation/inspection of any defect of the device region may allow processing changes to be timely identified.

Figure 2:
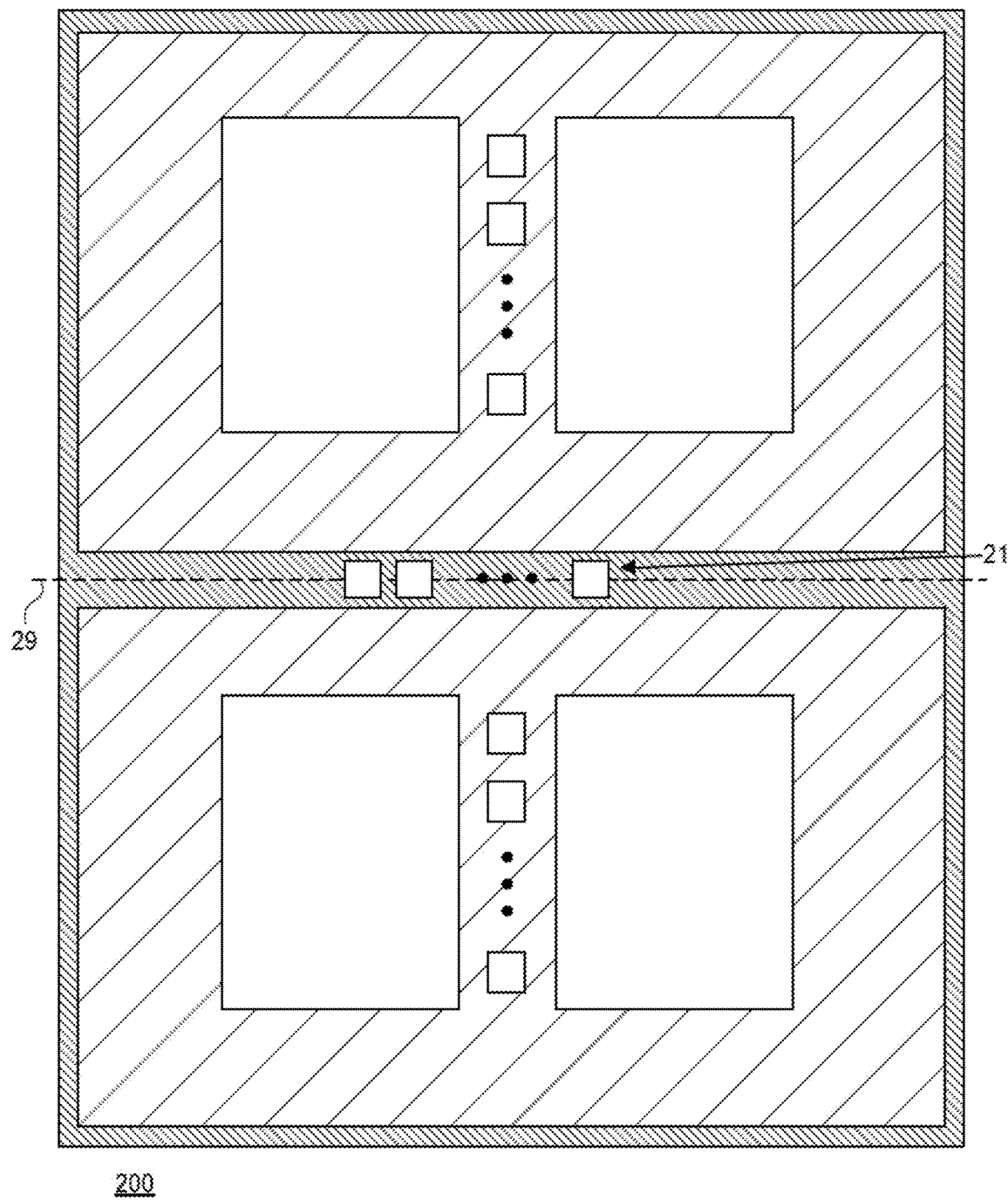
FIG. 2 is a diagram (top view) of test segments located in a region of a scribe line of a wafer to be cut into a plurality of chips, according to various embodiments.

FIG. 2 is a diagram (top view) of test segments 21 (the test segments 21 may be similar to any test segments described herein) located in a region of a scribe line 29 of a wafer 200 to be cut into a plurality of chips, according to various embodiments. It may be possible or practice to locate some or all of the test structures in an area of the wafer 200 that may be later cut (e.g., some or all of the test structures may end up being destroyed when the wafer 200 is cut into chips) because any test structure described herein may be used only for in-line detection of electrical fails on integrated circuits (e.g., not in end of line test and/or device operation).

Figure 3B:
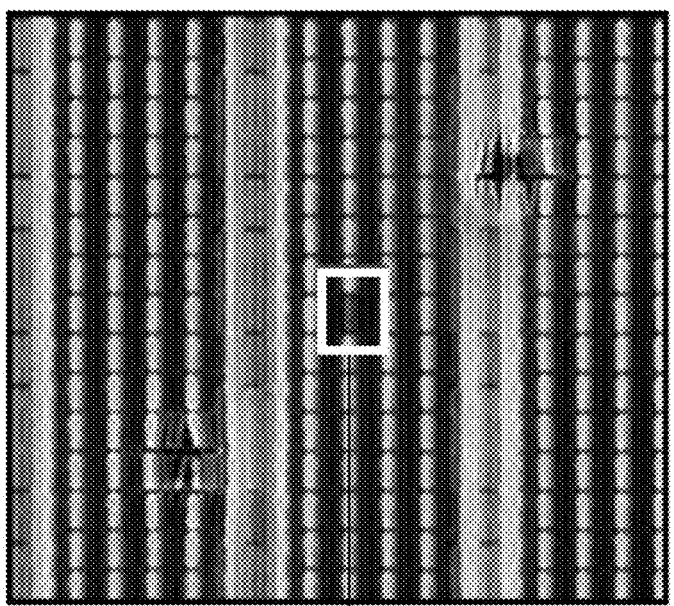
FIG. 3B is an e-beam image (top view) of a test structure similar to the test structure of FIG. 3A, according to various embodiments.
Figure 3C:
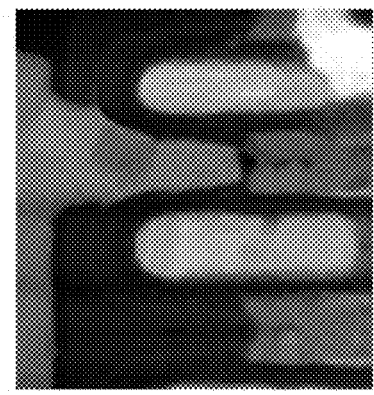
FIG. 3C is an electronic microscope image (cross section) of a selected test structure exhibiting a contact via open, according to various embodiments.
Figure 3A:
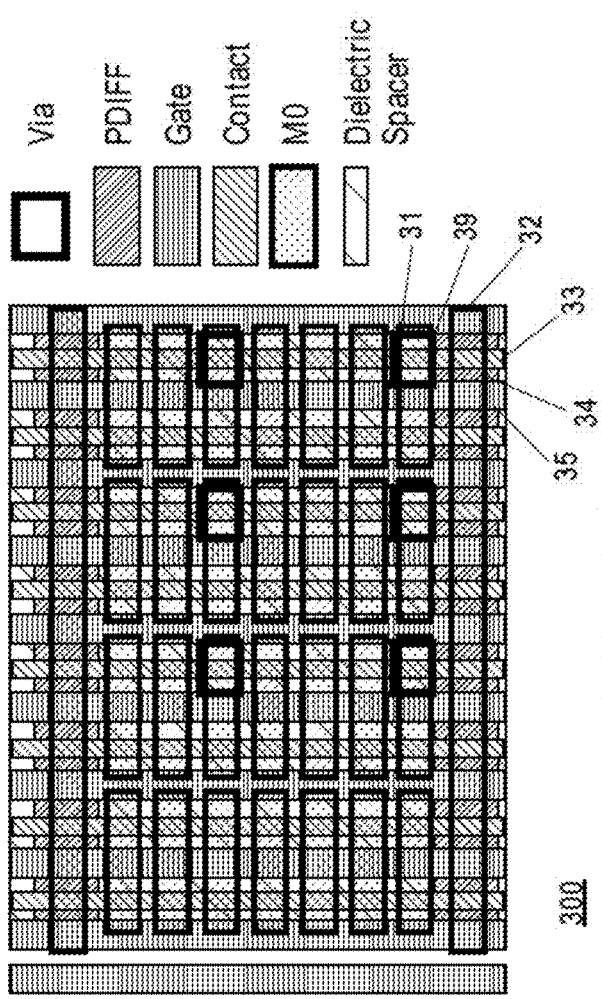
FIG. 3A is a diagram (top view) of a test structure for detection of contact via opens, according to various embodiments.

FIG. 3A is a diagram (top view) of a test structure 300 for detection of contact via opens, according to various embodiments. The example test structure 300 includes seven rows of test segments, which may be located in the areas of a chip 100 and/or wafer 200 as described previously with respect to FIGS. 1 and 2. The test segments may be formed from an upper metal layer (referred to as an MO layer) of the chip 100 and/or wafer 200 (e.g., the MO layer, which may extend over the entire area of the substrate of the chip 100).

The test structure 300 may include a selected test segment 31, e.g., a segment of an MO line. The selected test segment 31 may be electrically coupled to a contact line 33 of a contact layer below upper metal layer by placing a via 39. The contact line 33 may be grounded to the substrate through the diffusion of fins, either P/N type depending on the doping, such as PDIFF (P type diffusion) 34 of a fin of the substrate. In other words, the gate 35 may be intentionally shorted to the grounded contact line 33 using non-segmented MO line 32.

Selected ones of the test segments, such as test segment 31, may be formed on vias, such as via 39, to attempt to intentionally short the test segments to the grounded contact line 33. A shorted selected test segment may be flooded with electrons from the substrate and/or the gate 35, and as such, may appear bright in an e-beam image.

The remaining test segments (floating ones of the test segments) may be isolated from the grounded contact line 33. As explained previously, these may be placed between the selected test segment as desired to more easily resolve the e-beam image and/or enhancive scan efficiency. In this example, there are three rows of floating ones of the test segments between the rows of the selected test segments.

FIG. 3B is an e-beam image 350 (top view) of a test structure similar to the test structure of FIG. 3A, according to various embodiments. The e-beam image 350 may be captured inline. The e-beam image includes dark regions corresponding to the floating ones of the test segments 31. A selected region corresponding to the selected test segments 31 may appear bright or dark depending on whether the respective via 39 provides contact to the contact line 33, or not. In the illustrated image 350, only one of the selected test segments 31 is dark. An XTEM (transmission electron micrograph) validation of one of the dark one of the selected test segments 31 illustrates an open via defect in FIG. 3C.

The e-beam image 350 may show bright rows for the selected test segments 31 (FIG. 3A) and dark rows for the remaining test segments. The dark rows may provide spacing for visually inspecting the bright rows. The bright rows may include a gap 40 for any one of the via 39 exhibiting an open via defect. For example, the via 39 may include a defect between the via 39 and the corresponding individual test segment 31, or between the via 39 and the grounded contact line 33.

Figure 4B:
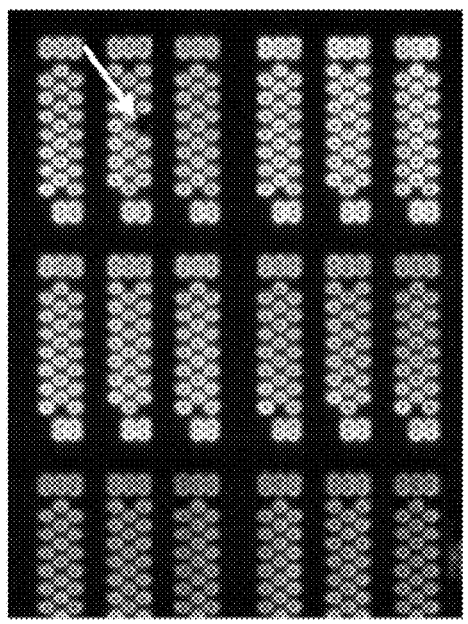
FIG. 4B is an e-beam image (top view) of a test structure similar to the test structure of FIG. 4A, according to various embodiments.
Figure 4C:
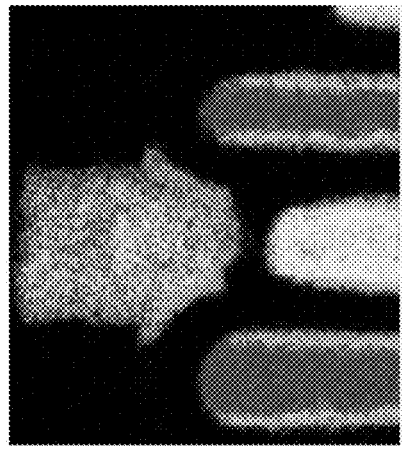
FIG. 4C is a transmission electronic microscope image (cross section) of a selected test structure exhibiting a gate via open, according to various embodiments.
Figure 4A:
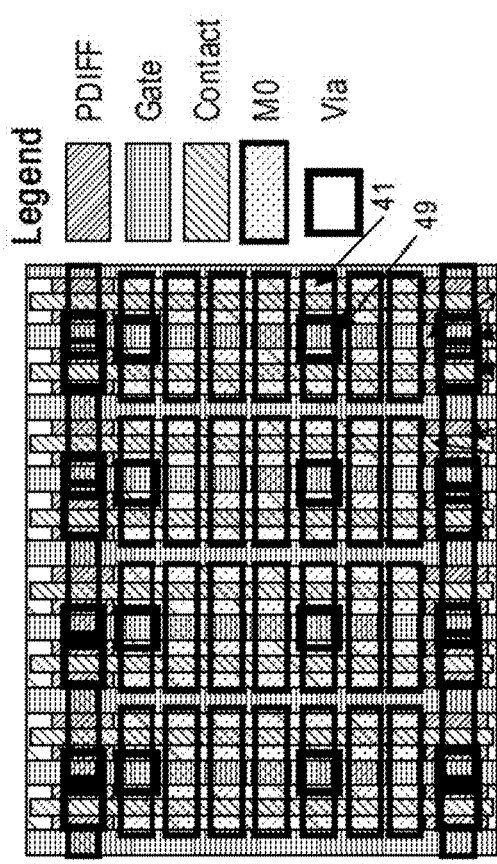
FIG. 4A is a diagram (top view) of a test structure for detection of gate via opens, according to various embodiments.

FIG. 4A is a diagram (top view) of a test structure 400 for detection of gate via opens, according to various embodiments. The selected test segment 41 may be similar to any selected test segment described herein, the MO line 42 may be similar any MO line described herein, the grounded contact line 43 may be similar to any grounded contact line described herein, the intentionally grounded gate 45 may be similar to any intentionally grounded gate described herein, and the via 49 may be similar to any via described herein.

In this embodiment, via 47 (to gate) electrically connects the gate 45 to the MO line 42 and a via 46 (to contact) electrically connects the contact line 43 to the MO line 42. If the via 49 corresponding to the selected test segment 41 does not exhibit an open via defect, then the selected test segment 41 may exhibit a first predefined response (e.g., appear bright) in an inline test. If the via 49 corresponding to the selected test segment 41 does exhibit the open via defect, then the selected test segment 41 may exhibit a second predefined response (e.g., appear dark) in the inline test.

FIG. 4B is an e-beam image 450 (top view) of a test structure similar to the test structure of FIG. 4A, according to various embodiments. The e-beam image 450 may be captured in-line. The e-beam image 450 includes dark regions corresponding to the floating ones of the test segments 41 of FIG. 4A. A selected region corresponding to the selected test segment 41 of FIG. 4A may appear bright or dark depending on whether the respective via 49 provides contact to the gate 45, or not. In the illustrated image, only one of the selected test segments 41 is dark. An XTEM validation of the selected test segments 41 illustrates an open via defect in the image of FIG. 4C.

Figure 5A:
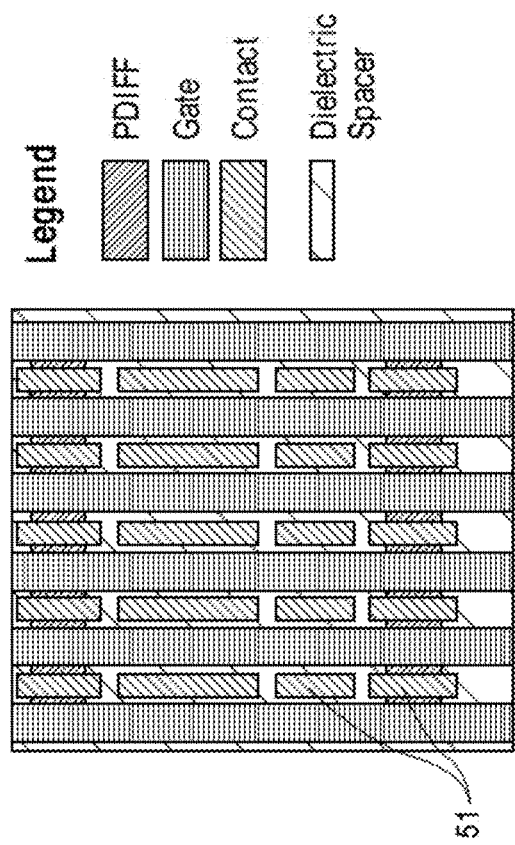
FIG. 5A is a diagram (top view) of a test structure for detection of contact end to end shorts, according to various embodiments.

FIG. 5A is a diagram (top view) of a test structure 500 for detection of contact end to end shorts, according to various embodiments. In this test structure 500, a plug is formed between each pair 51 of test segments. Each pair 51 includes a test segment formed over PDIFF, and this test segment may be coupled to the substrate (by silicidation of the contact metal to the epitaxial silicon or removing the dielectric layer formed on top of the fins, skipping formation of a dielectric layer between the test segment and a contact layer, or by forming a via, or the like, or combinations thereof). As such, the test segment formed over PDIFF may appear bright in the e-beam test.

Figure 5B:
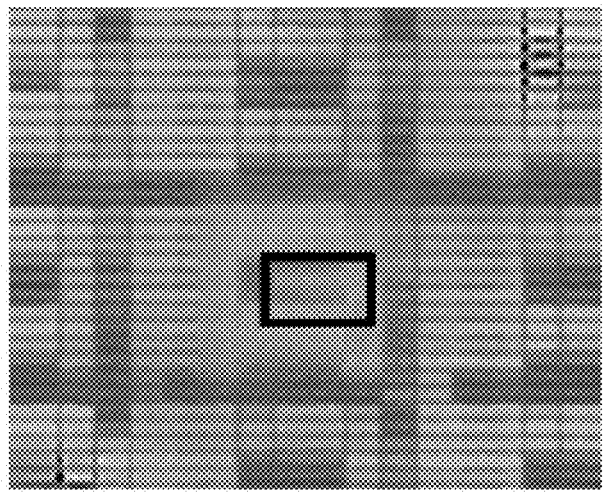
FIG. 5B is an e-beam image (top view) of a test structure similar to the test structure of FIG. 5A, according to various embodiments.
Figure 5C:
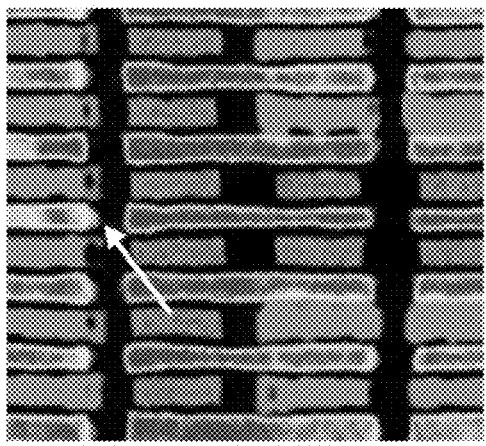
FIG. 5C is a transmission electronic microscope image (cross section) of a selected test structure exhibiting a contact end to end short, according to various embodiments.

The other test segment of the pair 51 may appear bright, or dark, in the e-beam test, depending on whether the plug has a predefined defect (a contact end to end short), or not. For instance, in the case of a contact end to end short, both test segments of the pair may be electrically connected, and as such both appear bright. In the case of a functioning plug, the other test segment may appear dark in the e-beam test. FIG. 5B is an e-beam image (top view) of a test structure similar to the test structure of FIG. 5A, in which a pair of test segments both appear bright in the e-beam test. FIG. 5C is a transmission electronic microscope image of a selected test segment exhibiting a contact end to end short.

Figure 6:
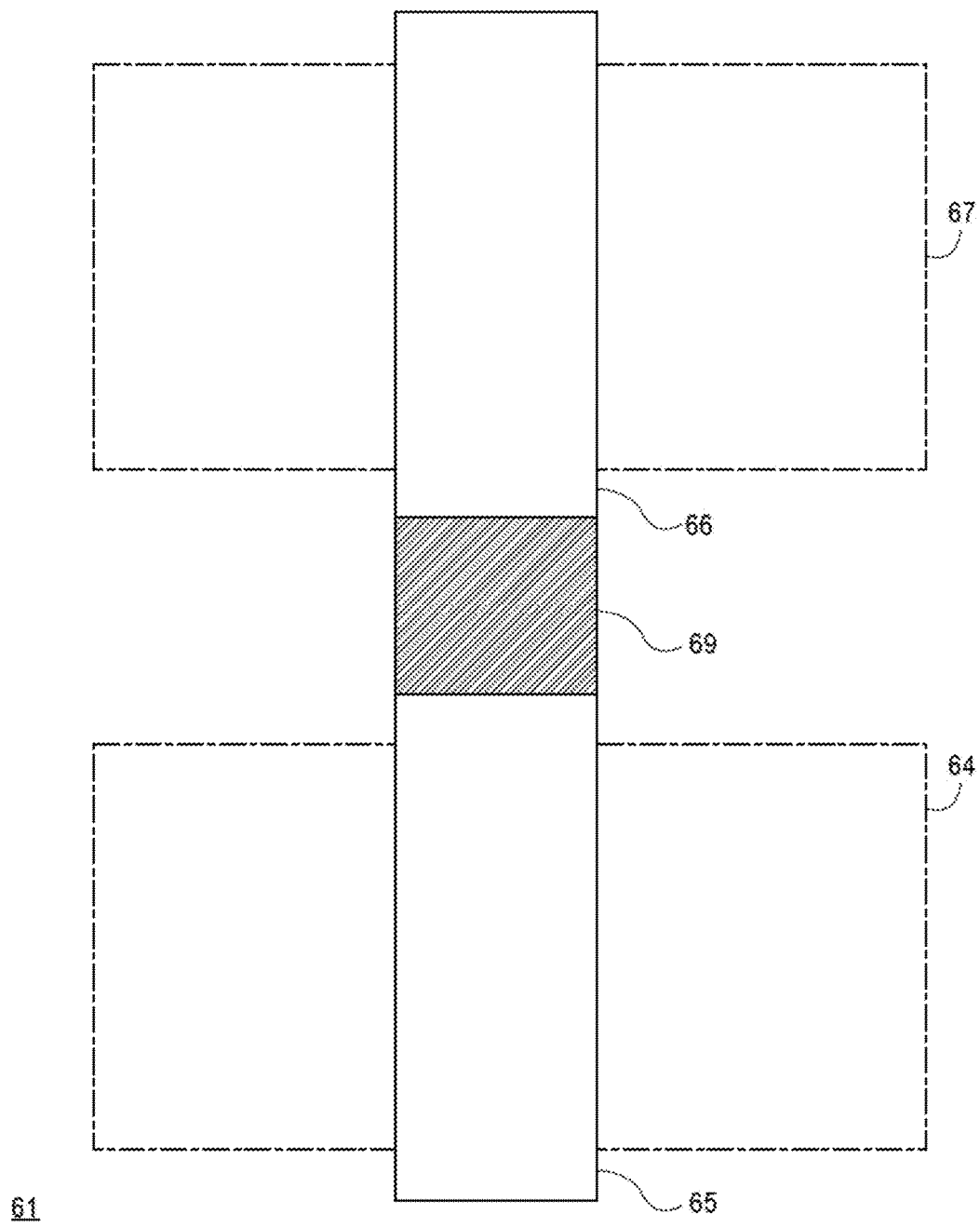
FIG. 6 is a diagram (top view) illustrating a pair of test segments in a test structure for detection of a gate/upper metal end to end short, according to various embodiments.

FIG. 6 is a diagram (top view) illustrating an individual pair 61 of test segments in a test structure for detection of a gate/upper metal end to end short. The pair 61 may be similar to pair 51 (FIG. 5A) or any other pair of test segments for a test structure described herein.

A first test segment 65 of the pair 61 may be grounded to a region 64 of the substrate corresponding to fins by skipping or removing the dielectric material on top of the fins, or grounding such as by use of a via in the case of upper layer metals. While some integrated circuit manufacturing may involve forming dummy fins (which are not utilized for any purpose) in filler region, some embodiments herein may have similar fin structures, but these fin structures may be utilized by the test structures. For instance, the first test segment 65 may be electrically coupled to these fin structures in some embodiments, and the fin structures may be utilized to provide electrons to the first test segment 65 to make it appear bright in the e-beam test.

The second test segment 66 may be formed in a region 67 that may not include fin structures. Whether or not the region 67 includes fin structures, the second test segment 66 may be floating so long as plug 69 is not defective.

FIG. 7A is a diagram (top view) of a test structure for detection of gate via to contact shorts, according to various embodiments. In this example, the test segments formed on via on gate may appear dark. In contrast, if the via connecting the gate to the MO breaches the dielectric spacer between the gate and the contact, the corresponding test segment may appear bright. FIG. 7B is an e-beam image (top view) of a test structure similar to the test structure of FIG. 7A, in which an individual one of the selected test segments appears bright, indicating a gate plug defect. FIG. 5C is a transmission electronic microscope image (cross section) of a selected test segment exhibiting a gate via to contact short. A similar structure may be used for detection other contact via to gate shorts.

In any example described herein, the metrology or detection of these defects may be done post any of the metallization layers (gate/contact/MO/vias/upper metal layers). Gates may be intentionally grounded by incorporating patterning to remove the gate oxide or other dielectric on top of fins, or by use of vias and upper metal layers.

Figure 8:
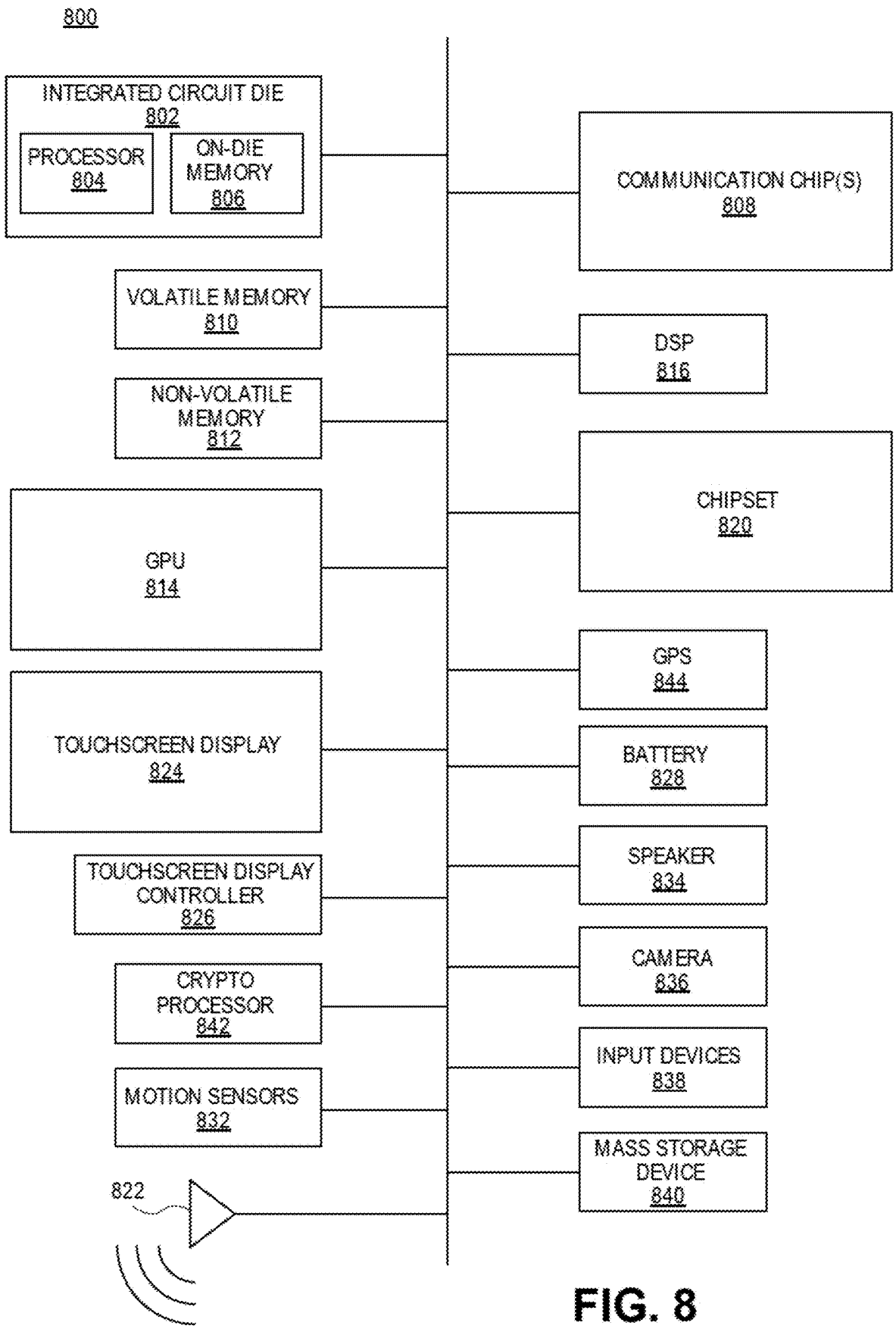
FIG. 8 is an illustration of a computing device built in accordance with an embodiment of the present disclosure, according to various embodiments.

FIG. 8 illustrates a computing device 800 in accordance with various embodiments of the present disclosure. The computing device 800 may include a number of components. In one embodiment, these components are attached to one or more motherboards. Some or all of these components may include a chip with transistors formed on a first area of a substrate, with test structures formed on any second remaining area of the substrate. Some of the test structures may be intact (say formed in the filler region) or others may not (say, formed along the scribe line). The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a CPU 804 as well as on-die memory 806, often used as cache memory, that can be provided by technologies such as embedded DRAM (eDRAM), SRAM, or spin-transfer torque memory (STT-MRAM).

Computing device 800 may include other components that may or may not be physically and electrically coupled to the substrate. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (e.g., a specialized processor that executes cryptographic algorithms within hardware), a chipset 820, at least one antenna 822 (in some implementations two or more antenna may be used), a display or a touchscreen display 824, a touchscreen controller 826, a battery 828 or other power source, a power amplifier (not shown), a voltage regulator (not shown), a global positioning system (GPS) device 828, a compass 830, a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 may include a substrate with a first area on which integrated circuits are formed, and a second different area on which any test structures described herein are formed. The term "processor" may refer to any device or portion of a device that processes electronic data from registers and/or memory to transform that electronic data into other electronic data that may be stored in registers and/or memory.

The communications logic unit 808 may also include a substrate with a first area on which integrated circuits are formed, and a second different area on which any test structures described herein are formed.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

Example 1 is an apparatus including a device region with one or more integrated circuits and a test region for in-line failure detection of the one or more integrated circuits using an in-line voltage contrast test, comprising: a substrate including a first area for the device region and a second different area for the test region; a gate layer formed over both of the areas, wherein a first section of the gate layer is formed over the first area and a second section of the gate layer is formed over the second area; one or more metal layers formed over both of the areas, the one or more metal layers including an upper metal layer having first and second sections formed above the first and second sections of the gate layer, respectively; wherein the one or more integrated circuits are formed from the first sections of the layers; and wherein the second section of the upper metal layer is segmented into test segments, each test segment to exhibit a predefined response during the in-line voltage contrast test depending on whether the test segment is shorted, or not, to the substrate and/or the second section of the gate layer.

Example 2 may include the subject matter of example 1 and/or any other example herein, wherein the first area comprises more than one non-contiguous subarea, and wherein a portion the second area is located between non-contiguous subareas.

Example 3 may include the subject matter of any of examples 1-2 and/or any other example herein, wherein a first subarea of the non-contiguous subareas corresponds to a first core of a microprocessor and a second different subarea of the non-contiguous subareas corresponds to a second core of the microprocessor, and wherein the portion of the second area comprises a filler region.

Example 4 may include the subject matter of any of examples 1-3 and/or any other example herein, wherein a first subarea of the non-contiguous subareas corresponds to a portion of a first microprocessor, and a second different subarea of the non-contiguous areas corresponds to a portion of a second different microprocessor, and wherein the portion of the second area comprises a scribe line region.

Example 5 may include the subject matter of any of examples 1-4 and/or any other example herein, wherein the test segments test for at least one of gate end to end shorts, contact end to end shorts, via opens, or via shorts.

Example 6 may include the subject matter of any of examples 1-5 and/or any other example herein, wherein a set of the test segments tests for the via opens, wherein a via is formed below each one of the test segments of the set, wherein each via includes a first side to contact a surface of the corresponding test segment and a second opposite side to contact a different surface, and in the case that at least one of the vias is open the corresponding at least one of the test segments to appear dark during the in-line voltage contrast test.

Example 7 may include the subject matter of any of examples 1-6 and/or any other example herein, wherein a set of the test segments tests for via shorts, wherein a via is formed below each one of the test segments of the set, wherein each via includes a side to contact a surface of the corresponding test segment, a second opposite side, and sidewalls to contact a dielectric, and in the case that at least one of sidewalls is not isolated by the dielectric the corresponding at least one of the test segments to appear bright during the in-line voltage contrast test.

Example 8 may include the subject matter of any of examples 1-7 and/or any other example herein, wherein a set of the test segments tests for end to end shorts, wherein each one of the test segments to contact a dielectric plug, and in the case that at least one of the dielectric plugs is defective the corresponding at least one of the test segments to appear bright during the in-line voltage contrast test.

Example 9 may include the subject matter of any of examples 1-8 and/or any other example herein, wherein the one or more metal layers include a contact layer having first and second sections formed below the first and second sections of the upper metal layer, respectively, the second section of the contact layer including a grounded contact line, the one or more metal layers to intentionally short a gate of the second section of the gate layer to the grounded contact line.

Example 10 may include the subject matter of any of examples 1-9 and/or any other example herein, further comprising a via formed between the second section of the upper metal layer and a lower layer of the one or more layers.

Example 11 is a system, comprising: a processor; a memory coupled to the processor; wherein the memory or the processor includes a device region with one or more integrated circuits and a test region for in-line failure detection of the one or more integrated circuits using an in-line voltage contrast test, the memory or the processor further including: a substrate including a first area for the device region and a second different area for the test region; and a gate layer formed over both of the areas, wherein a first section of the gate layer is formed over the first area and a second section of the gate layer is formed over the second area; one or more metal layers formed over both of the areas, the one or more metal layers including an upper metal layer having first and second sections formed above the first and second sections of the gate layer, respectively; wherein the one or more integrated circuits are formed from the first sections of the layers; and wherein the second section of the upper metal layer is segmented into test segments, each test segment to exhibit a predefined response during the in-line voltage contrast test depending on whether the test region is shorted, or not, to the substrate and/or the second section of the gate layer.

Example 12 may include the subject matter of example 11 and/or any other example herein, wherein the one or more metal layers include a contact layer having first and second sections formed below the first and second sections of the upper metal layer, respectively, and wherein the memory or the processor further includes: vias formed below at least some of the test segments, each via to electrically connect a respective one of the test segments to a contact line of the second section of the contact layer.

Example 13 may include the subject matter of any of examples 11-12 and/or any other example herein, wherein the vias are formed below only a subset of the test segments.

Example 14 may include the subject matter of any of examples 11-13 and/or any other example herein, wherein the one or more metal layers include a contact layer having first and second sections formed below the first and second sections of the upper metal layer, respectively; wherein the second section of the upper metal layer includes an MO line; first vias formed below at least some of the test segments, each first via to electrically connect a respective one of the test segments to a respective gate of the second section of the gate layer; second vias formed below the MO line, each second via to electrically connect a respective contact line of the second section of the contact layer to the MO line; and third vias formed below the MO line, each third via to electrically connect a respective one of the gates to the MO line.

Example 15 may include the subject matter of any of examples 11-14 and/or any other example herein, wherein the test segments include a pair of test segments separated by a dielectric plug: wherein a first test segment of the pair is formed over a fin of the second area of the substrate, the first test segment electrically connected with the fin, wherein a second test segment of the pair is floating unless the dielectric plug comprises a predefined defect.

Example 16 may include the subject matter of example 15 and/or any other example herein, forming one or more metal layers over a first area of a substrate and a second area of the substrate; patterning a first section of an upper metal layer of the one or more layers to form integrated circuits; segmenting a second section of the upper metal layer of the one or more layers to form test segments, each test segment to exhibit a predefined response during an in-line voltage contrast test depending on whether the test segment is shorted, or not, to the substrate and/or the second section of the gate layer; performing an end of line detection on the integrated circuits; wherein the an in-line voltage contrast test is performed prior to the end of line detection.

Example 17 may include the subject matter of any of examples 15-16 and/or any other example herein, capturing an electronic microscope image of one or more of the test segments depending on a result of the in-line voltage contrast test; and in that case that the electronic microscope image is captured, inspecting the image prior to the end of line detection.

Example 18 may include the subject matter of any of examples 15-17 and/or any other example herein, wherein the first area comprises a first region for a first chip of a wafer and a second region for a second chip of the wafer, the first and second regions separated by a third region associated with a scribe line; wherein the second area includes the third region.

Example 19 may include the subject matter of any of examples 15-18 and/or any other example herein, wherein the method further comprises: dicing the wafer along the scribe line, wherein the in-line voltage contrast test is performed prior to dicing the wafer.

Example 20 may include the subject matter of any of examples 15-19 and/or any other example herein, wherein the first area comprises two or more non-contiguous subareas corresponding to two or more components of a chip, the two or more non-contiguous subareas separated by a filler region; wherein the second area includes the filler region.

The above description of illustrated implementations of various embodiments, including what is described in the Abstract, is not intended to be exhaustive or to limit the present disclosure to the precise forms disclosed. While specific implementations of, and examples for, various embodiments are described herein for illustrative purposes, various equivalent modifications are possible within the scope of the present disclosure, as those skilled in the relevant art will recognize.

What is claimed is:

1. An apparatus including a device region with one or more integrated circuits and a test region for in-line failure detection of the one or more integrated circuits using an in-line voltage contrast test, the apparatus comprising:
a substrate including a first area for the device region and a second different area for the test region;
a gate layer formed over both of the areas, wherein a first section of the gate layer is formed over the first area and a second section of the gate layer is formed over the second area;
one or more metal layers formed over both of the areas, the one or more metal layers including an upper metal layer having first and second sections formed above the first and second sections of the gate layer, respectively;

wherein the one or more integrated circuits are formed from the first sections of the layers; and wherein the second section of the upper metal layer is segmented into a set of test segments, wherein a predetermined subset of the set of test segments includes first test segments shorted to the substrate and/or the second section of the gate layer, all of the first test segments of the predetermined subset to appear bright during the in-line voltage contrast test, each remaining second test segment of the set of test segments to selectively appear bright, or dark, respectively depending on whether the remaining second test segment of the set of test segments corresponds to, or does not correspond to, a short defect that shorts the remaining second test segment to the substrate and/or the second section of the gate layer;

wherein the set of test segments include a pair of test segments separated by a dielectric plug, the pair including a non-floating test segment of the first test segments and another test segment of the remaining second test segments;

wherein the non-floating test segment of the pair is electrically connected to a fin of the test region independently of the other test segment of the pair, the fin adjacent to a dummy fin electrically isolated from the fin, and the other test segment of the pair is either:

a floating test segment, or electrically connected to the non-floating test segment of the pair, only if the dielectric plug is defective, and said other test segment of the pair to appear bright only if the dielectric plug is defective and otherwise to appear dark.

2. The apparatus of claim 1, wherein at least one test segment of the test segments of the predetermined subset is part of a same row of ones of the remaining second test segments, in which the at least one test segment is located between the ones of the remaining second test segments in the row.

3. The apparatus of claim 1, wherein the remaining second test segments are in a different rows than one or more rows including the test segments of the predetermined subset.

4. The apparatus of claim 1, wherein the first area comprises more than one non-contiguous subarea, and wherein a portion the second area is located between non-contiguous subareas, wherein a first subarea of the non-contiguous subareas corresponds to a first core of a microprocessor and a second different subarea of the non-contiguous subareas corresponds to a second core of the microprocessor, and wherein the portion of the second area comprises a filler region, wherein a first subarea of the non-contiguous subareas corresponds to a portion of a first microprocessor, and a second different subarea of the non-contiguous areas corresponds to a portion of a second different microprocessor, and wherein the portion of the second area comprises a scribe line region.

5. The apparatus of claim 1, wherein the remaining second test segments test for at least one of:

gate end to end shorts,
contact end to end shorts,
via opens, or
via shorts.

6. The apparatus of claim 5, wherein a grouping of the remaining second test segments tests for the via opens, wherein a via is formed below each one of the test segments of the grouping, wherein each via includes a first side to contact a surface of the corresponding test segment of the grouping and a second opposite side to contact a different surface, and in the case that at least one of the vias is open the corresponding at least one of the test segments of the grouping to appear dark during the in-line voltage contrast test.

7. The apparatus of claim 5, wherein a grouping of the remaining second test segments tests for via shorts, wherein a via is formed below each one of the test segments of the grouping, wherein each via includes a side to contact a surface of the corresponding test segment of the grouping, a second opposite side, and sidewalls to contact a dielectric, and in the case that at least one of sidewalls is not isolated by the dielectric the corresponding at least one of the test segments of the grouping to appear bright during the in-line voltage contrast test.

8. The apparatus of claim 1, wherein the one or more metal layers include a contact layer having first and second sections formed below the first and second sections of the upper metal layer, respectively, the second section of the contact layer including a grounded contact line, the one or more metal layers to intentionally short a gate of the second section of the gate layer to the grounded contact line.

9. The apparatus of claim 8, further comprising a via formed between the second section of the upper metal layer and a lower layer of the one or more layers.

10. A system, comprising:

a processor;

a memory coupled to the processor;

wherein the memory or the processor includes a device region with one or more integrated circuits and a test region for in-line failure detection of the one or more integrated circuits using an in-line voltage contrast test, the memory or the processor further including:

a substrate including a first area for the device region and a second different area for the test region; and a gate layer formed over both of the areas, wherein a first section of the gate layer is formed over the first area and a second section of the gate layer is formed over the second area;

one or more metal layers formed over both of the areas, the one or more metal layers including an upper metal layer having first and second sections formed above the first and second sections of the gate layer, respectively;

wherein the one or more integrated circuits are formed from the first sections of the layers; and wherein the second section of the upper metal layer is segmented into a set of test segments, wherein a predetermined subset of the set of test segments includes first test segments shorted to the substrate and/or the second section of the gate layer, all of the first test segments of the predetermined subset to appear bright during the in-line voltage contrast test, each remaining second test segment of the set of test segments to selectively appear bright, or dark, depending on whether the remaining second test segment includes, or does not include, respectively a short defect that shorts the remaining second test segment to the substrate and/or the second section of the gate layer;

wherein the set of test segments include a pair of test segments separated by a dielectric plug, the pair including a non-floating test segment of the first test segments and another test segment of the remaining second test segments;

wherein the non-floating test segment of the pair is electrically connected to a fin of the test region independently of the other test segment of the pair, the fin adjacent to a dummy fin electrically isolated from the fin, and the other test segment of the pair is either:

a floating test segment, or
electrically connected to the non-floating test segment of the pair, only if the electric plug is defective, and said other test segment of the pair to appear bright only if the dielectric plug is defective and otherwise to appear.

11. The system of claim 10, wherein the one or more metal layers include a contact layer having first and second sections formed below the first and second sections of the upper metal layer, respectively, and wherein the memory or the processor further includes:
vias formed below at least some of the first test segments, each via to electrically connect a respective one of the first test segments to a contact line of the second section of the contact layer.

12. The system of claim 11, wherein the vias are formed below only some of the first test segments.

13. The system of claim 10, wherein the one or more metal layers include a contact layer having first and second sections formed below the first and second sections of the upper metal layer, respectively;
wherein the second section of the upper metal layer includes an MO line;
first vias formed below at least some of the first test segments, each first via to electrically connect a respective one of the first test segments to a respective gate of the second section of the gate layer;
second vias formed below the MO line, each second via to electrically connect a respective contact line of the second section of the contact layer to the MO line; and
third vias formed below the MO line, each third via to electrically connect a respective one of the gates to the MO line.

14. The system of claim 10,
wherein the non-floating test segment of the pair is formed over the fin of the second area of the substrate.

* * * * *